United States Patent
Ni et al.

(10) Patent No.: US 10,699,876 B2
(45) Date of Patent: Jun. 30, 2020

(54) METHOD OF CLEANING ELECTROSTATIC CHUCK

(71) Applicant: ADVANCED ION BEAM TECHNOLOGY, INC., Hsin-chu (TW)

(72) Inventors: Yu-Ho Ni, Hsin-Chu (TW); Chun-Chin Kang, Hsin-Chu (TW); Chieh-Jen Yang, Hsin-Chu (TW)

(73) Assignee: Advanced Ion Beam Technology, Inc., Hsin-chu (TW)

( * ) Notice: Subject to any disclaimer, the term of this patent is extended or adjusted under 35 U.S.C. 154(b) by 288 days.

(21) Appl. No.: 15/297,551

(22) Filed: Oct. 19, 2016

(65) Prior Publication Data

US 2017/0125211 A1 May 4, 2017

(30) Foreign Application Priority Data

Oct. 28, 2015 (TW) .............................. 104135345 A

(51) Int. Cl.
*H01J 37/30* (2006.01)
*H01J 37/20* (2006.01)
(Continued)

(52) U.S. Cl.
CPC ................ *H01J 37/30* (2013.01); *B08B 7/00* (2013.01); *H01J 37/20* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 4,259,145 A * | 3/1981 | Harper | H01J 27/14 |
| | | | 156/345.39 |
| 5,507,874 A * | 4/1996 | Su | B08B 7/0035 |
| | | | 118/723 R |

(Continued)

FOREIGN PATENT DOCUMENTS

| | | |
|---|---|---|
| CN | 101133186 A | 2/2008 |
| CN | 101360567 A | 2/2009 |

(Continued)

OTHER PUBLICATIONS

Office Action dated Sep. 23, 2016 in corresponding Taiwan Patent Application No. 104135345.

(Continued)

*Primary Examiner* — Erin F Bergner
(74) *Attorney, Agent, or Firm* — Dentons US LLP

(57) ABSTRACT

A method of cleaning an electrostatic chuck (ESC) is disclosed. An ion beam is delivered to a work surface of an ESC where no workpiece is held. The interaction between the ion beam and the depositions on the work surface may remove the depositions away the ESC, no matter the interaction is physical bombardment and/or chemical reaction. Hence, the practical chucking force between the ESC and the held workpiece may be less affected by the depositions formed on the work surface during the period of holding no workpiece, no matter the photoresist dropped away the workpiece and/or the particles inside the process chamber. Depends on the details of the depositions, such as the structure, the thickness and the material, the details of ion beam may be correspondingly adjusted, such as the ion beam current, the ion beam energy and the kinds of ions. For example, a low energy ion beam may be used to reduce the potential damages on work surface of the ESC. For example, both the oxygen and the inert gas may be used to generate the ion beam for removing the depositions and protecting the dielectric layer inside the work surface of the ESC.

20 Claims, 4 Drawing Sheets

(51) Int. Cl.
*H01L 21/683* (2006.01)
*B08B 7/00* (2006.01)
*H02N 13/00* (2006.01)
*H01J 37/304* (2006.01)

(52) U.S. Cl.
CPC ......... *H01L 21/6833* (2013.01); *H02N 13/00* (2013.01); *B08B 7/0035* (2013.01); *H01J 37/304* (2013.01); *H01J 2237/022* (2013.01); *H01J 2237/2002* (2013.01); *H01J 2237/30466* (2013.01)

(56) References Cited

U.S. PATENT DOCUMENTS

| | | | |
|---|---|---|---|
| 5,554,854 A | 9/1996 | Blake | |
| 5,911,833 A * | 6/1999 | Denison | B08B 7/0035 134/1.1 |
| 6,221,169 B1 * | 4/2001 | Bernstein | H01J 37/317 134/1 |
| 6,277,235 B1 * | 8/2001 | Wing | C23C 16/4405 118/723 I |
| 2002/0153024 A1 | 10/2002 | Akiba | |
| 2010/0095979 A1 | 4/2010 | Hua et al. | |
| 2012/0241412 A1 | 9/2012 | Murakami | |
| 2013/0248738 A1 * | 9/2013 | Suuronen | H01J 37/3171 250/492.21 |
| 2015/0107618 A1 | 4/2015 | Sun et al. | |

FOREIGN PATENT DOCUMENTS

| | | |
|---|---|---|
| CN | 102265387 A | 11/2011 |
| CN | 102693892 A | 9/2012 |
| CN | 103962341 A | 8/2014 |
| CN | 104094376 A | 10/2014 |
| CN | 104205306 A | 12/2014 |
| CN | 104979190 A | 10/2015 |
| EP | 1052676 A2 | 11/2000 |
| JP | 9-36059 A | 2/1997 |
| JP | 11-186185 A | 7/1999 |
| JP | 2001-3154 A | 1/2001 |
| JP | 2010-140963 A | 6/2010 |
| JP | 2015-518628 A | 7/2015 |
| TW | 201013819 A | 4/2010 |
| TW | 201306166 A | 2/2013 |
| WO | 1999/31712 A1 | 6/1999 |

OTHER PUBLICATIONS

Office Action received for Chinese Patent Application No. 201610946708.5, dated Jul. 29, 2019, 9 pages (Official Copy Only) (See Communication under 37 CFR § 1.98(a) (3)).

Office Action received for Japanese Patent Application No. 2016-210547, dated Jul. 30, 2019, 8 pages (4 pages of English Translation and 4 pages of Official Copy).

* cited by examiner

```
┌─────────────────────────────────────────────────────────────┐
│  providing an electrostatic chuck, wherein no workpiece     │~202
│  is held on the work surface of the electrostatic chuck     │
└─────────────────────────────────────────────────────────────┘
                               │
                               ▼
┌─────────────────────────────────────────────────────────────┐
│  delivering an ion beam to the work surface of the electrostatic │~204
│  chuck, so as to use the ion beam for cleaning the work surface  │
└─────────────────────────────────────────────────────────────┘
```

FIG.2A

```
┌─────────────────────────────────────────────────────────────┐
│  adjusting the ion beam, before the ion beam being delivered to a │~200
│  work surface of the electrostatic chuck                    │
└─────────────────────────────────────────────────────────────┘
                               │
                               ▼
┌─────────────────────────────────────────────────────────────┐
│  providing an electrostatic chuck, wherein no workpiece     │~202
│  is held on the work surface of the electrostatic chuck     │
└─────────────────────────────────────────────────────────────┘
                               │
                               ▼
┌─────────────────────────────────────────────────────────────┐
│  delivering an ion beam to the work surface of the electrostatic │~204
│  chuck, so as to use the ion beam for cleaning the work surface  │
└─────────────────────────────────────────────────────────────┘
```

FIG.2B

METHOD OF CLEANING ELECTROSTATIC CHUCK

CROSS-REFERENCE TO RELATED APPLICATIONS

The entire contents of Taiwan Patent Application No. 104135345, filed on Oct. 28, 2015, from which this application claims priority, are incorporated herein by reference.

BACKGROUND OF THE INVENTION

1. Field of the Invention

The present invention generally relates to a method of cleaning an electrostatic chuck, and more particularly to a method of delivering an ion beam to a work surface of the electrostatic chuck, which is used for holding a workpiece, so as to remove the deposition from the work surface.

2. Description of Related Art

The ion implantation is to deliver dopants into the material in order to change the character of the material, such as adding trivalent element ions and/or pentavalent element ions to improve the conductivity of the non-conductive material. In recent years, the ion implantation is commonly used, such as in the processes for integrated circuits, memories, light emitting diodes, solar cells, flat panel displays, and the like.

When an ion beam is used to perform the ion implantation on a workpiece, if the cross sectional area of the ion beam is smaller than the surface area of the workpiece (or the area of the to-be-implanted region of the work surface), the ion beam and the workpiece have to proceed a relative movement on a plane which is intersected with the moving direction of the ion beam (not being limited to mutually perpendicular), so as to confirm the entire workpiece (or at least the entire to-be-implanted portion of the surface of the workpiece) can be implanted properly. As the size of the workpiece increases, such as the diameter of the wafer being developed from 8 inches to 12 inches, the relative movement between the ion beam and the workpiece becomes more important, because it is not easy for the ion beam having a large cross sectional area to provide and also maintain a uniform cross sectional ion beam current. Generally speaking, the electrostatic chuck is widely used for holding the workpiece, and the relative movement between the workpiece and the ion beam may be generated by moving at least one of the electrostatic chuck and the ion beam.

Basically, one side of the electrostatic chuck is configured to hold a work surface of the workpiece, and the other side of the electrostatic chuck is connected to the pedestal and/or a backside of a chamber wall of a process reaction chamber. There are pluralities of electrodes embedded in a dielectric layer on the work surface, and the electric fields will be generated on the surface of the dielectric layer when the voltages are applied to these electrodes. Then, pluralities of charges with opposite polarity are generated on the surface of the dielectric layer and the surface of the workpiece respectively, so as to hold the workpiece on the work surface of the electrostatic chuck. Therefore, it is an essential factor that if there is any contamination on the work surface of the electrostatic chuck, which may affect the interaction between the work surface and the workpiece.

Although, in the process of one workpiece being implanted by the ion beam, the work surface would be covered by the workpiece so that there might be no contamination formed on the work surface (unless the workpiece has already been contaminated), however the work surface of the electrostatic chuck would be exposed at the time interval between after workpiece being removed and before another workpiece being held. The work surface of the electrostatic chuck would also be exposed even in the process of moving the to-be-processed workpiece into the process reaction chamber and/or moving out the processed workpiece from the process reaction chamber. At this time, the electrostatic chuck usually is contaminated and the deposition is generated on the work surface. Because of the exiting deposition, the held strength between the work surface and the workpiece usually will be affected, and it usually will also result in that the electric charges of the work surface cannot be released regularly. The common contamination source at least includes, but not limited to, the photoresist left on the workpiece for the process, the particles floating inside the process reaction chamber which is generated from the interaction between the ion beam and the photoresist of the workpiece, the particles floating inside the process reaction chamber which is generated by the collision of some ions in the ion beam delivering process, and the deposition deposited on the chamber wall of the process reaction chamber in the procedure of the ion implantation.

The conventional method of cleaning the electrostatic chuck can be briefly described in FIG. 1 and the following descriptions. Firstly, as shown in the step 101, the conventional method is to provide an electrostatic chuck, wherein no workpiece is held on the work surface of the electrostatic chuck. Secondly, as shown in the step 103, the conventional method is to remove and moved out the electrostatic chuck from the process reaction chamber. Then, as shown in the step 105, the conventional method is to clean the electrostatic chuck, and at least the work surface of the electrostatic chuck is cleaned. Herein, most of the time, the chemical cleaning agents are used for cleaning the work surface, and the backside of the electrostatic chuck can also be cleaned. Then, as shown in the step 107, the conventional method is to move the electrostatic chuck into the process reaction chamber and process the installment. Afterwards, as shown in the step 109, the conventional method is to calibrate the electrostatic chuck to confirm if the electrostatic chuck is installed correctly or not. At last, as shown in the step 111, the conventional method is to confirm the cleaning result of the electrostatic chuck. The common method of confirming the cleaning result is to provide one workpiece to be held on the work surface of the electrostatic chuck, and then measure if the attracting force between the workpiece and the electrostatic chuck is normal or not. Of course, the other methods may also be used for confirming whether the electrostatic chuck is cleaned appropriately or not, such as both of the electrostatic chuck and workpiece being moved so as to measure if the workpiece is held appropriately or not, or comparing the original color of the work surface of the electrostatic chuck with the cleaned color of the work surface of the electrostatic chuck, or comparing the cleaned color of the work surface of the electrostatic chuck with the color of the work surface of new electrostatic chuck.

Obviously, the conventional method of cleaning the electrostatic chuck has some unavoidable disadvantages. Firstly, it takes time to remove and install the electrostatic chuck, and it is necessary to calibrate the electrostatic chuck so as to confirm whether the electrostatic chuck is installed correctly or not. Further, in the processes of removing, moving and installing the electrostatic chuck, it is possible to cause the damage to the electrostatic chuck. Moreover, as it needs to break vacuum in the process of moving out the electrostatic chuck from the process reaction chamber, therefore it will cause the additional contamination, and it will also take times to create vacuum again in the process of moving the electrostatic chuck into the process reaction chamber. Finally, after the electrostatic chuck is installed in the process reaction chamber of the ion implantation machine, it also needs to test the whole ion implantation machine again, which often takes some workpieces to operate the test for the ion implantation, and thus the conventional method is not only time consuming but also costly.

Thus, a novel method of cleaning the electrostatic chuck is urgently needed, which is more efficient and less costly than the conventional method of cleaning the electrostatic chuck.

SUMMARY OF THE INVENTION

The present invention relates to a method of cleaning an electrostatic chuck. When no workpiece is held on the electrostatic chuck, an ion beam is delivered to a work surface of the electrostatic chuck for cleaning the work surface. When there are depositions on the work surface, the interaction between the ion beam and the depositions on the work surface may remove the depositions away from the electrostatic chuck, no matter whether the interaction is physical bombardment or chemical reaction or the combination thereof.

Further, the current, energy and ion elements of the ion beam can be determined based on the structure, thickness, material and the other information of the depositions. The structure, thickness, material and the other information of the depositions can be obtained by measuring the depositions on the work surface of the electrostatic chuck before the step of delivering the ion beam, or can be the deposition information obtained from the operation experience of the ion implantation machine.

Moreover, a low energy ion beam can be used to avoid causing damages on the work surface of the electrostatic chuck. In addition, the ion beam may be neither generated by trivalent element ions nor generated by pentavalent element ions, so that the ion beam can be used for removing depositions and also reducing the influence on the conductivity of the dielectric layer of the work surface of the electrostatic chuck.

Apparently, as it is needless for the present invention to open the process reaction chamber and to move out the electrostatic chuck for performing the cleaning process and then install the electrostatic chuck inside the process reaction chamber, it not only can save the time of dismantling, removing, installing and calibrating, but also does not need to test machine to confirm the status of the ion implantation machine, the process reaction chamber can also be kept in high vacuum without breaking vacuum and then creating vacuum again. Thus, compared with the conventional method of cleaning the electrostatic chuck, the present invention can significantly simplify the maintenance process, reduce the cleaning cost and save the time for the calibration and the inspection of the machine.

Besides, the present invention does not limit how to create the ion beam and how to deliver the ion beam to the electrostatic chuck of the process reaction chamber. For example, the ion beam can be generated in the ion source chamber, and then the ion beam may be delivered to the electrostatic chuck after the ion beam is adjusted by the mass analyzer, the acceleration/deceleration electrodes, the magnets and the others devices. For example, the ion beam can be generated in the plasma chamber, and the ion beam is then extracted from the plasma chamber by the electrodes or the like and delivered to the electrostatic chuck.

BRIEF DESCRIPTION OF THE DRAWINGS

FIG. 2A to FIG. 2D illustrate some flow charts of the method for cleaning an electrostatic chuck according to preferred embodiments of the present invention.

DETAILED DESCRIPTION OF THE INVENTION

Figure 1:
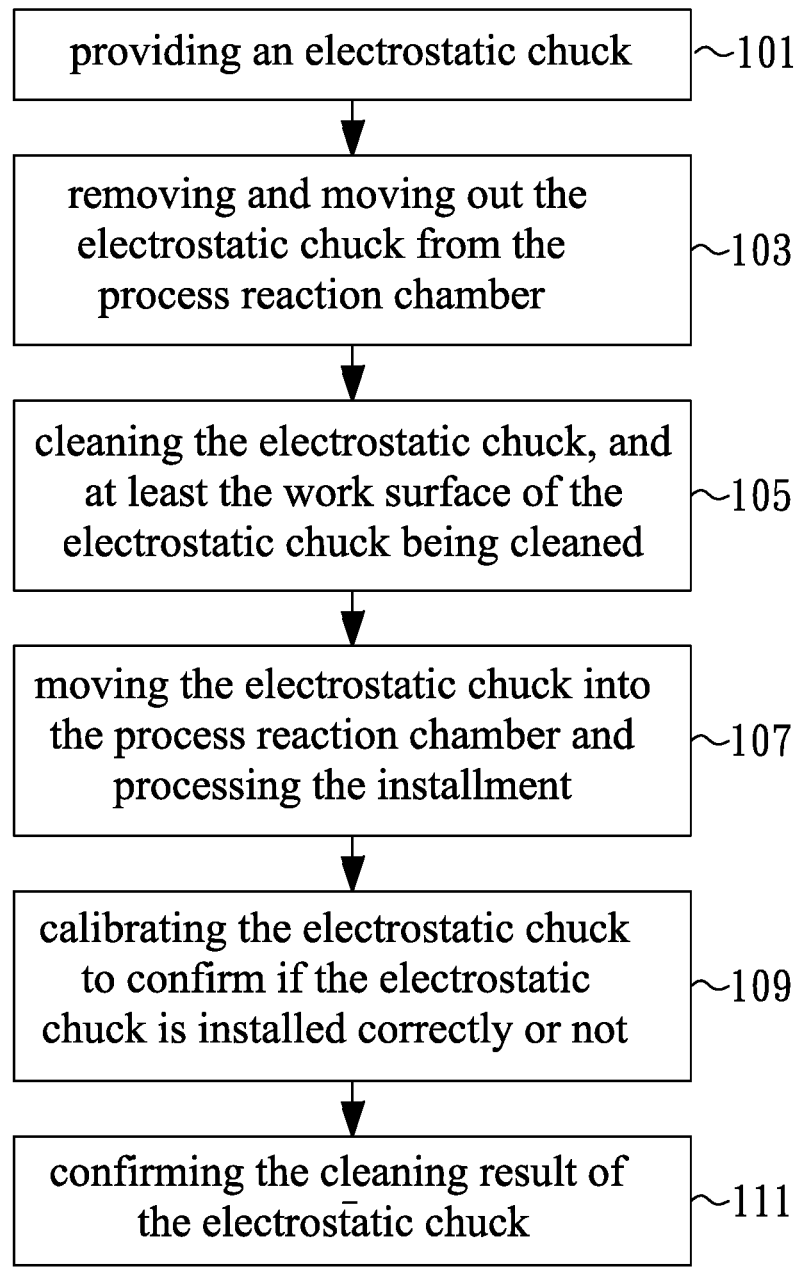
FIG. 1 illustrates a flow chart of the conventional method for cleaning an electrostatic chuck.

The detailed description of the present invention will be discussed in the following embodiments, and these embodiments of the present invention are not intended to limit the scope of the invention, but also suitable for other applications. The illustrations reveal a few details, but however it should be understood that the design details of the disclosed elements may be different with the revealed ones, unless it is the situation that the characteristics of the elements are explicitly limited.

The present invention is based on the concept of cleaning the electrostatic chuck without moving the electrostatic chuck out and in the process reaction chamber, so as to avoid the several disadvantages of the conventional method of cleaning the electrostatic chuck. In particular, as only the contamination (such as the deposition) existing on the work surface of the electrostatic chuck for holding the workpiece will affect the held strength between the electrostatic chuck and the workpiece, it is acceptable to only clean the work surface.

The basic concept of the present invention is to use an ion beam to clean the work surface of the electrostatic chuck. The ordinary ion implantation is to deliver the ion beam to the workpiece held by the electrostatic chuck, so as to perform the ion implantation on the workpiece. Relatively speaking, the present invention is to deliver the ion beam to the work surface of the electrostatic chuck which is used for holding the workpiece, when there is no workpiece held by the electrostatic chuck. Thus, the present invention may directly use any well-known, on-developing or to-be-developed ion implantation machine without modifying any hardware or adding any components. Therefore, the process that the present invention uses the ion beam to process the work surface of the electrostatic chuck is similar to the process that the general ion implantation method uses the ion beam to process the workpiece held by the electrostatic chuck, and it only needs to adjust the ion beam and the parameters of the ion implantation according to the work surface of the electrostatic chuck and the deposition on the work surface.

As shown in FIG. 2A, the method of cleaning an electrostatic chuck according to one preferred embodiment of the present invention is illustrated. Firstly, as shown in the step 202, the method is to provide an electrostatic chuck, wherein no workpiece is held on the work surface of the electrostatic chuck. Secondly, as shown in the step 204, the method is to delivering an ion beam to the work surface of the electrostatic chuck, so as to use the ion beam for cleaning the work surface. In the whole process of delivering the ion beam to the work surface, the electrostatic chuck and the ion beam are disposed inside the process reaction chamber. That is, the electrostatic chuck and the ion beam are disposed in a vacuum environment.

Herein, at least depending on the ion elements used in the ion beam and the elements of the deposition deposited on the work surface, the ion beam can remove the deposition (i.e., contamination) by using the chemical reaction and the physically bombard simultaneously, or by the physically bombard only, or by the chemical reaction only. For example, as one main source of the deposition is photoresist, the material of which mostly is polymer, phenolic resin, epoxy resin and polyisoprene rubber, etc. Therefore, if the oxygen ion (like O+) is used to generate the ion beam, it often can be combined simultaneously with the chemical reaction method and the physically bombard method in order to remove the deposition.

Herein, the element with high chemical activity can be used for generating the ion beam delivered to the work surface of the electrostatic chuck, in order to simultaneously use the chemical reaction method and the physically bombard method for removing the deposition, so that the situation that the efficiency of removing the deposition is low if the energy of the ion beam is low and the situation that the work surface of the electrostatic chuck may be damaged if the energy of the ion beam is high can both be avoided. For example, the ion beam can be an oxygen ion beam, either by using O+ or O++ or using other oxygen ions. For example, the ion beam can also be a hydrogen ion beam or a fluoride ion beam. In contrast, if there is no any suitable ion for being combined with the material of the deposition, so as to convert the deposition into other materials which can be easily removed from the work surface, the ion beam can be an inert gas ion beam or a nitrogen ion beam, which can simply remove the deposition from the work surface by the physically bombard method.

In addition, when the work surface of the electrostatic chuck is covered by a dielectric layer, the ion used in the ion beam, generally speaking, is neither a trivalent element ion nor a pentavalent element ion so as not to increase the conductivity of the dielectric layer.

As shown in FIG. 2B, the method of cleaning an electrostatic chuck is illustrated according to a preferred embodiment of the present invention. Firstly, as shown in the step 200, the method is to adjust the ion beam, before the ion beam is delivered to a work surface of the electrostatic chuck. Secondly, as shown in the step 202, the method is to provide the electrostatic chuck, wherein no workpiece is held on the work surface of the electrostatic chuck. Then, as shown in the step 204, the method is to deliver the ion beam to the work surface of the electrostatic chuck, so that the ion beam may be used for cleaning the work surface. To adjust the ion beam in the step 200 is for the step 204 to clean the work surface more efficiently and is also for reducing the possible damage of the work surface which may be caused in the step 204. The structure, the thickness, the material, the distribution and the other information of the deposition which the step 200 requires, can be obtained in advance by measuring the deposition on the work surface of the electrostatic chuck at the time before the ion beam is delivered, or through the operation experience of the ion implantation machine.

Herein, the step 200 may adjust the ion beam according to the deposition of the work surface, before the ion beam is delivered to the work surface of the electrostatic chuck, in order to clean the work surface efficiently. The energy of the ion beam may be related to the structure of the deposition. When the structure of the deposition is denser, the energy of the ion beam energy will be adjusted to be higher, so that the energy of the ion beam is enough to remove the deposition from the work surface by the physically bombard method.

Herein, ion beam current may be related with the thickness of the deposition. When the thickness of the deposition is thicker, the current of the ion beam will be adjusted to be higher, so that the ion beam has enough ions to react with the deposition for removing the deposition from the work surface.

Herein, the step 200 can adjust the ion beam according to the work surface of the electrostatic chuck, before the ion beam is delivered to the work surface of the electrostatic chuck, in order that the damage of the work surface which is caused by the ion beam may be minimized. Herein, the energy of the ion beam can be related to the material of the work surface of the electrostatic chuck. If the ions of the ion beam may be easily implanted inside the material of the work surface, the energy of the ion beam will be adjusted to be lower. Thus, the ion beam having the low energy not only can remove the deposition, but also can reduce the damage towards the work surface.

Herein, the step 200 may adjust the relative movement between the ion beam and the electrostatic chuck according to the distribution of the deposition on the work surface, before the ion beam is delivered to the work surface of the electrostatic chuck, in order to clean the work surface efficiently. Herein, the relative movement between the electrostatic chuck and the ion beam can make the ion beam scan the entire work surface evenly, and also can make the ion beam evenly scan all the area of the work surface covered by the deposition. Apparently, if the deposition is evenly distributed on the whole work surface, it will be more efficient to scan the entire work surface. However, if the deposition is particularly existed on some regions of the work surface, it will be more efficient to concentratedly scan those regions of the work surface.

Figure 2C:
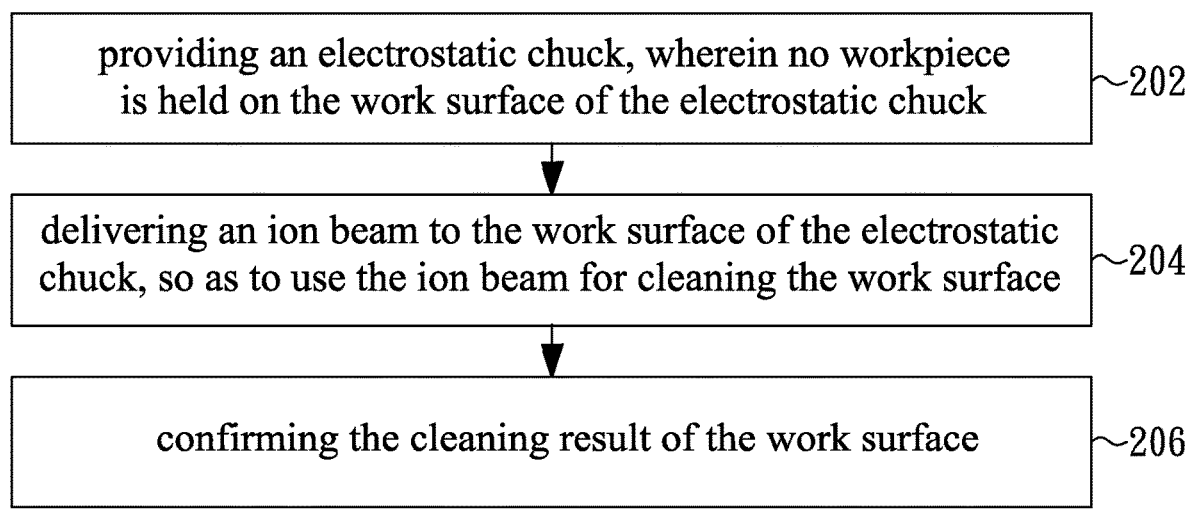

The present invention provides a preferred embodiment for the method of cleaning the electrostatic chuck, as shown in FIG. 2C. Firstly, as shown in the step 202, the step is to provide the electrostatic chuck, wherein no workpiece is held on the work surface of the electrostatic chuck. Secondly, as shown in the step 204, the step is to deliver the ion beam to the work surface of the electrostatic chuck, so that the ion beam can be used to clean the work surface. Then, as shown in step 206, the step is to confirm the cleaning result of the work surface. Herein, before the cleaning result of the work surface is confirmed, it needs to stop delivering the ion beam to the work surface of the electrostatic chuck, by pausing the generation of the ion beam, or by pausing the action of delivering the ion beam to the position of the electrostatic chuck in the step 204, or by moving the electrostatic chuck to a new position which is different from the position in the step 204 without changing the delivering path of the ion beam.

Herein, any method for confirming the cleaning result of the work surface is not limited to use in the present invention, which can be any well-known method, or any on-developing or any to-be-appeared method. For example, the work surface of the electrostatic chuck can be used for holding the workpiece and then the held strength between the electrostatic chuck and the workpiece may be measured. It may be like that the ideal held strength between a new electrostatic chuck and the various kinds of workpieces can be measured in advance. Therefore, when the step 204 is performed to clean a specific workpiece held by the electrostatic chuck, the actual held strength can be obtained by measuring the cleaned work surface of the electrostatic chuck and the specific workpiece, so that the cleaning result in the step 204 may be determined by the difference between the actual held strength and the ideal held strength. For example, the work surface of the electrostatic chuck can be used to hold the workpiece, and then both of the electrostatic chuck and the workpiece are moved together to measure if the workpiece is held appropriately. For example, both of the electrostatic chuck and the workpiece can be moved along a moving trajectory and a moving velocity of an ion implantation procedure, so as to confirm whether the cleaned work surface of the electrostatic chuck is able to hold the workpiece or not. For example, the color change of the work surface can be analyzed by comparing the original color of the work surface before using the ion beam to clean and the cleaned color of the work surface after being cleaned by the ion beam. Because the color of the material of the work surface usually is different from the color of the deposition on the work surface, the color change of the work surface of the electrostatic chuck often is an index which can reflect the quantity and distribution of the deposition.

Herein, there are many possible conditions of stopping delivering the ion beam to the work surface and confirming the cleaning result of the electrostatic chuck. For example, it may stop delivering the ion beam to the work surface and confirming the cleaning result of the electrostatic chuck, when it reaches a predetermined time interval from the beginning of delivering the ion beam on the surface of the workpiece. Herein, the predetermined time interval usually is set according to the experience, such as at least the minimum time required for the ion beam being able to process the entire work surface. For example, it may stop delivering the ion beam to the work surface and confirm the cleaning result of the electrostatic chuck, when it has processed the whole work surface at least one time or it has processed the region of the work surface that exists deposition (that is, the predetermined cleaning region), since it starts to deliver the ion beam to the surface of the workpiece. Herein, as the relative movement trajectory of the ion beam and the electrostatic chuck can be preset, and the distribution of the deposition on the electrostatic chuck work surface usually can be pre-confirmed, (if the color of the deposition is different from the color of the material of the work surface), it may be easy to set the specific switching conditions for delivering the ion beam and confirming the cleaning result, and it also may be easy to change when the switching condition are met. For example, it may measure the change of the work surface during the process of delivering the ion beam to the surface of the workpiece, such as measuring the color change of the work surface, and when the measured change amount of the work surface (such as the amount of the color change) reaches a predetermined change amount, it may stop delivering the ion beam to the work surface and confirm the cleaning result of the electrostatic chuck.

Figure 2D:
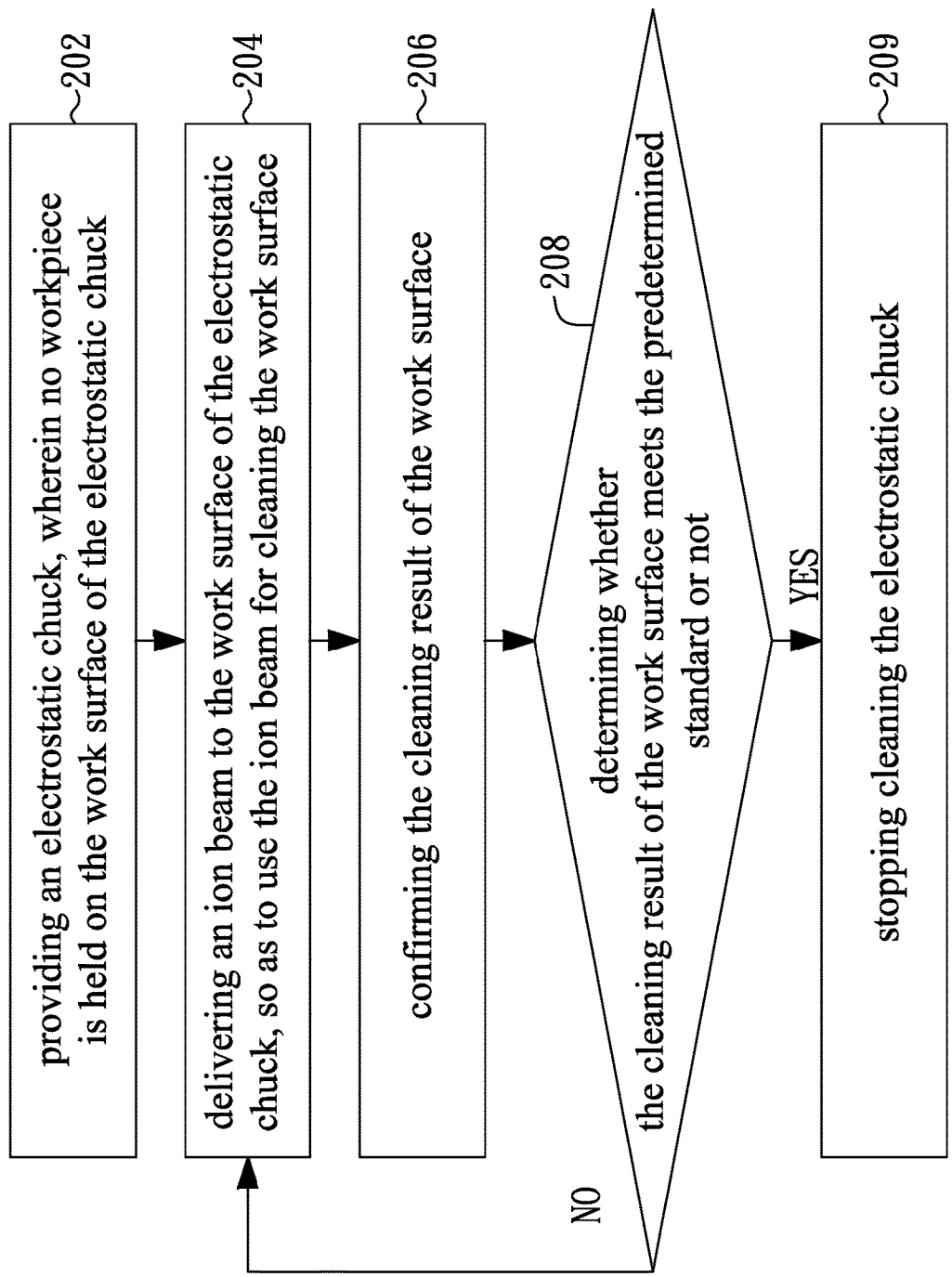

The present invention provides a preferred embodiment of the method of cleaning the electrostatic chuck, as shown in FIG. 2D. After performing the step 202, the step 204 and the step 206 in sequence, the step 208 is performed to determine whether the cleaning result of the work surface meets the predetermined standard or not. If not, it will return to the step 202 for delivering the ion beam to the work surface of the electrostatic chuck once more, so that the ion beam may be used again for cleaning the work surface. If the cleaning result of the work surface meets the predetermined standard, then it will stop cleaning the electrostatic chuck as shown in the step 209.

According to the above description of the present invention, the present invention, compared to the conventional method of cleaning the electrostatic chuck, has at least following obvious advantages. Firstly, the present invention can maintain the electrostatic chuck inside the process reaction chamber from the beginning to the end of the operation process, so that it may be unnecessary to break vacuum to moving out the electrostatic chuck from the process reaction chamber and then move the cleaned electrostatic chuck into the process reaction chamber and create vacuum again, and thus it will be obvious to save the time and reduce the risk of the process reaction chamber being polluted. Secondly, in the present invention, the configuration of the electrostatic chuck in the process reaction chamber is not changed at all, and even the electrostatic chuck is not removed for the cleaning step, and then the step for installing the cleaned electrostatic chuck is also needless, so that it is unnecessary to calibrate the position and the direction of the electrostatic chuck, and there is also no need to test the whole ion implantation machine, so as to confirm whether the ion implantation machine can operate regularly or not. Thirdly, the present invention can directly use the existing ion implantation machine, or can directly clean the work surface of the electrostatic chuck according to the existing ion implantation procedures, so that there is no difficulty in practicing the present invention.

Herein, the present invention is briefly compared with the conventional method of cleaning the electrostatic chuck method in the time and the cost of reaching the same cleaning result of the work surface of the electrostatic chuck. The present invention takes about at least two hours to use the oxygen ion beam for cleaning the work surface of an electrostatic chuck, and the required oxygen ion beam can be provided from the process using the carbon dioxide as the processing gas, cost of which is low. On the contrary, the conventional method of cleaning the electrostatic chuck takes at least one or two hours to remove and calibrate the electrostatic chuck, and it will also take about three or four hours to test the whole ion implantation machine, and thus it totally takes five to six hours, wherein the time of using the chemical cleaning agents to clean the electrostatic chuck is not included. Further, to test the ion implantation machine one time often needs some of workpieces (for example, a piece of wafer costs about US $200), and the cost of using chemical cleaning agents to clean the electrostatic chuck is about US $130. Apparently, compared with the conventional method of cleaning the electrostatic chuck, the present invention can obviously save the time required, and the cost such as the material for the operation can be lower.

Of course, the present invention can only clean the work surface of the electrostatic chuck, and the conventional method of cleaning the work surface can also clean the backside of the electrostatic chuck (because the whole electrostatic chuck has been removed and moved from the process reaction chamber). However, the backside of the electrostatic chuck will essentially not affect the held strength between the electrostatic chuck and the workpiece, thus this difference will essentially not affect the practicality of the present invention. At most, the uncleaned deposition accumulated on the backside of the electrostatic chuck is also a source of the deposition on the work surface of the electrostatic chuck.

Moreover, although there are some well-known skills that use plasma to clean the ion source chamber which provides the ion beam, however the present invention is to use the ion beam for cleaning the work surface of the electrostatic chuck. Moreover, the ion elements of the plasma used to clean the ion source chamber is decided by the deposition on the chamber wall of the ion source chamber, but the ion elements of the ion beam in the present invention is decided by the deposition on the work surface of the electrostatic chuck. Thus, the present invention is different from these prior arts, and the present invention also cannot be simply obtained from these prior arts. For example, the structure of the ion source chamber is usually unable to generate the ion beam in the ion source chamber, or it is usually unable to generate the ion beam on the portion with the deposition needed to be cleaned. For example, the present invention can use oxygen ion beam to clean the work surface of the electrostatic chuck, but the oxygen ion plasma will increase the oxidation rate of the metal in the ion source chamber. Thus, the oxygen ion plasma usually cannot be used in these prior arts to avoid causing the damage to the ion source chamber.

Although specific embodiments have been illustrated and described, it will be appreciated by those skilled in the art that various modifications may be made without departing from the scope of the present invention, which is intended to be limited solely by the appended claims.

What is claimed is:

1. A method of cleaning an electrostatic chuck, comprising:
    providing an electrostatic chuck;
    generating an ion beam from an ion source chamber;
    adjusting the ion beam with a mass analyzer; and
    prior to positioning a wafer on a work surface for an ion implantation process:
        delivering the adjusted ion beam to the work surface of the electrostatic chuck, in order to clean the work surface by using the adjusted ion beam;
        stopping delivery of the adjusted ion beam to the work surface of the electrostatic chuck; and
        after delivery of the adjusted ion beam has stopped:
            using the work surface to hold a wafer, and
            measuring a held strength between the electrostatic chuck and the wafer to confirm a cleaning result of the work surface.

2. The method of claim 1, wherein the electrostatic chuck and the ion beam both are disposed in a vacuum environment of a process reaction chamber.

3. The method of claim 1, wherein delivering the adjusted ion beam to the work surface of the electrostatic chuck comprises at least one of the following:
    the adjusted ion beam physically bombarding a deposition layer on the work surface, so that the deposition layer is removed from the work surface; and
    the adjusted ion beam and the deposition layer causing a chemical reaction, so that the deposition layer is transformed into other materials and removed from the work surface.

4. The method of claim 1, wherein the ion beam is an oxygen ion beam.

5. The method of claim 1, wherein an ion of the ion beam is selected from one of the following: an oxygen ion, a hydrogen ion, a nitrogen ion, a fluoride ion and an inert gas ion.

6. The method of claim 1, wherein a surface layer of the work surface of the electrostatic chuck is covered by a dielectric layer, and an ion of the ion beam is neither a trivalent element ion nor a pentavalent element ion.

7. The method of claim 1, wherein measuring a held strength between the electrostatic chuck and the wafer to confirm the cleaning result of the work surface further comprises:
    determining whether the held strength between the electrostatic chuck and the wafer meets a predetermined standard;
    in accordance with a determination that the held strength between the electrostatic chuck and the wafer does not meet the predetermined standard, delivering the adjusted ion beam to the work surface of the electrostatic chuck a second time; and
    in accordance with a determination that the held strength between the electrostatic chuck and the wafer does meet the predetermined standard, stopping a cleaning process of the electrostatic chuck.

8. The method of claim 1, wherein stopping delivery of the adjusted ion beam to the work surface is based on a condition, the condition comprising at least one of following:
    reaching a predetermined time interval from the beginning of delivering the adjusted ion beam to the work surface;
    processing the entirety of the work surface with the adjusted ion beam; and
    processing a predetermined cleaning region of the work surface.

9. The method of claim 1, further comprising:
    measuring a change of the work surface while delivering the adjusted ion beam to the work surface; and
    stopping delivery of the adjusted ion beam to the work surface when the change of the work surface is measured to reach a predetermined value.

10. The method of claim 9, wherein measuring the change of the work surface comprises analyzing a color change of the work surface simultaneously as the adjusted ion beam cleans the work surface.

11. The method of claim 1, wherein an energy value of the ion beam is selected in accordance with one or more properties of a deposition layer on the work surface before delivering the adjusted ion beam to the work surface of the electrostatic chuck.

12. The method of claim 11, wherein the energy value of the ion beam is selected based on a density of a structure of the deposition layer.

13. The method of claim 1, wherein a current of the ion beam is selected on a thickness of a deposition layer.

14. The method of claim 1, wherein an energy value of the ion beam is selected in accordance with a composition of the work surface before delivering the adjusted ion beam to the work surface of the electrostatic chuck.

15. The method of claim 14, wherein the energy value of the ion beam is selected based on an extent at which ions in the adjusted ion beam penetrate into a material of the work surface.

16. The method of claim 1, wherein delivering the adjusted ion beam to the work surface of the electrostatic chuck further comprises scanning the adjusted ion beam over a predetermined area of the work surface of the electrostatic chuck.

17. The method of claim 16, wherein the predetermined area of the work surface is based on at least one of following:
    a distribution of the deposition layer on the work surface; and
    the size and shape of the work surface.

18. The method of claim 1, further comprising:
    while using the work surface to hold the wafer, moving both of the electrostatic chuck and the wafer to measure if the wafer is held appropriately.

19. The method of claim 1, further comprising:
    analyzing a color change of the work surface before and after the adjusted ion beam is used for cleaning the work surface.

20. The method of claim 1, further comprising:
determining an area of the work surface covered by a deposition layer; and
wherein delivering the ion beam to the work surface comprises, scanning the ion beam over an area of the work surface of the electrostatic chuck corresponding to the area of the work surface covered by the deposition layer.

* * * * *